[12] United States Patent
Huang et al.

(10) Patent No.: US 11,422,594 B2
(45) Date of Patent: Aug. 23, 2022

(54) METHOD AND APPARATUS FOR DYNAMIC ADJUSTMENT OF A DOCKING STATION FAN OPERATION

(71) Applicant: DELL PRODUCTS, LP, Round Rock, TX (US)

(72) Inventors: Johnny Tc Huang, New Taipei (TW); TseAn Gino Chu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 350 days.

(21) Appl. No.: 16/679,873

(22) Filed: Nov. 11, 2019

(65) Prior Publication Data

US 2021/0141430 A1    May 13, 2021

(51) Int. Cl.
*G06F 1/20* (2006.01)
*G05B 15/02* (2006.01)
*H05K 7/20* (2006.01)
*G06F 1/16* (2006.01)

(52) U.S. Cl.
CPC .............. *G06F 1/206* (2013.01); *G05B 15/02* (2013.01); *G06F 1/1632* (2013.01); *G06F 1/203* (2013.01); *H05K 7/20172* (2013.01); *H05K 7/20209* (2013.01)

(58) Field of Classification Search
CPC ........ G06F 1/206; G06F 1/1632; G05B 15/02

USPC ............................................................ 700/28
See application file for complete search history.

(56) References Cited

U.S. PATENT DOCUMENTS

| 5,969,939 | A | 10/1999 | Moss et al. |
| 6,011,687 | A | 1/2000 | Gluskoter et al. |
| 6,038,128 | A | 3/2000 | Hood, III et al. |
| 10,416,734 | B2 | 9/2019 | Casparian et al. |
| 2005/0161197 | A1* | 7/2005 | Rapaich ............... G06F 1/1632 165/80.4 |
| 2011/0162035 | A1* | 6/2011 | King ................... H04L 41/0813 726/1 |
| 2013/0148298 | A1* | 6/2013 | Liu ........................ G06F 1/1632 361/695 |
| 2016/0281742 | A1* | 9/2016 | Rivera ................. F04D 25/0673 |
| 2017/0273214 | A1* | 9/2017 | Casparian ............. G06F 1/1632 |
| 2018/0253125 | A1* | 9/2018 | Morrison ................. H05K 7/20 |
| 2020/0383235 | A1* | 12/2020 | Yu .......................... H02J 7/0044 |

* cited by examiner

*Primary Examiner* — Robert A Cassity
(74) *Attorney, Agent, or Firm* — Larson Newman, LLP

(57) ABSTRACT

An information handling system has a docking station that is coupled to a host. The host includes a system fan and a host sensor that is configured to detect a physical location of the docking station and to measure an acoustic sound level of the system fan. The host further selects a mode of operation for the docking station. Based on the selected mode of operation, the detected physical location, and the measured acoustic sound level, the host dynamically adjusts operations of the docking station.

20 Claims, 6 Drawing Sheets

300

310

| System Fan Sound Level (S) 312 | System Fan Speed 314 | Docking Station Fan EC 350 ||
|---|---|---|---|
| | | Hysteresis 352 | Trip (°C) 354 |
| 0 | OFF | ----- | 44 |
| 0.4 | 1900 | 38 | 55 |
| 0.7 | 2200 | 45 | 76 |
| 1.5 | 2900 | 66 | 80 |
| 2 | 3200 | 70 | 84 |
| 2.5 | 3600 | 74 | ----- |

320

| System Fan Sound Level (S) 312 | System Fan Speed 314 | Docking Station Fan EC 350 ||
|---|---|---|---|
| | | Hysteresis 352 | Trip (°C) 354 |
| 0 | OFF | ----- | 39 |
| 0.4 | 1900 | 33 | 50 |
| 0.7 | 2200 | 40 | 71 |
| 1.5 | 2900 | 61 | 75 |
| 2 | 3200 | 65 | 79 |
| 2.5 | 3600 | 69 | ----- |

*FIG. 3*

| System Fan Sound Level (S) 312 | System Fan Speed 314 | Docking Station Fan EC 350 ||
|---|---|---|---|
| | | Hysteresis 352 | Trip (°C) 354 |
| 0 | OFF | ----- | 34 |
| 0.4 | 1900 | 28 | 45 |
| 0.7 | 2200 | 35 | 66 |
| 1.5 | 2900 | 56 | 70 |
| 2 | 3200 | 60 | 74 |
| 2.5 | 3600 | 64 | ----- |

*FIG. 4*

METHOD AND APPARATUS FOR DYNAMIC ADJUSTMENT OF A DOCKING STATION FAN OPERATION

FIELD OF THE DISCLOSURE

This disclosure generally relates to information handling systems, and more particularly relates to dynamic adjustment of a docking station fan operation.

BACKGROUND

As the value and use of information continues to increase, individuals and businesses seek additional ways to process and store information. One option is an information handling system. An information handling system generally processes, compiles, stores, and/or communicates information or data for business, personal, or other purposes. Because technology and information handling needs and requirements may vary between different applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, reservations, enterprise data storage, or global communications. In addition, information handling systems may include a variety of hardware and software resources that may be configured to process, store, and communicate information and may include one or more computer systems, data storage systems, and networking systems.

SUMMARY

An information handling system includes a docking station that is coupled to a host. The docking station includes a docking station fan. The host includes a system fan and a host sensor that is configured to detect a physical location of the docking station and to measure an acoustic sound level of the system fan. The host further includes a processor that is configured to control an operation of the docking station fan based upon the detected physical location and the measured acoustic sound level.

BRIEF DESCRIPTION OF THE DRAWINGS

It will be appreciated that for simplicity and clarity of illustration, elements illustrated in the Figures have not necessarily been drawn to scale. For example, the dimensions of some of the elements are exaggerated relative to other elements. Embodiments incorporating teachings of the present disclosure are shown and described with respect to the drawings presented herein, in which:

FIGS. 3-4 are reference data tables that are utilized by a processor to control an operation of a docking station according to an embodiment of the present disclosure;

The use of the same reference symbols in different drawings indicates similar or identical items.

DETAILED DESCRIPTION OF DRAWINGS

The following description in combination with the Figures is provided to assist in understanding the teachings disclosed herein. The following discussion will focus on specific implementations and embodiments of the teachings. This focus is provided to assist in describing the teachings, and should not be interpreted as a limitation on the scope or applicability of the teachings.

Figure 1:
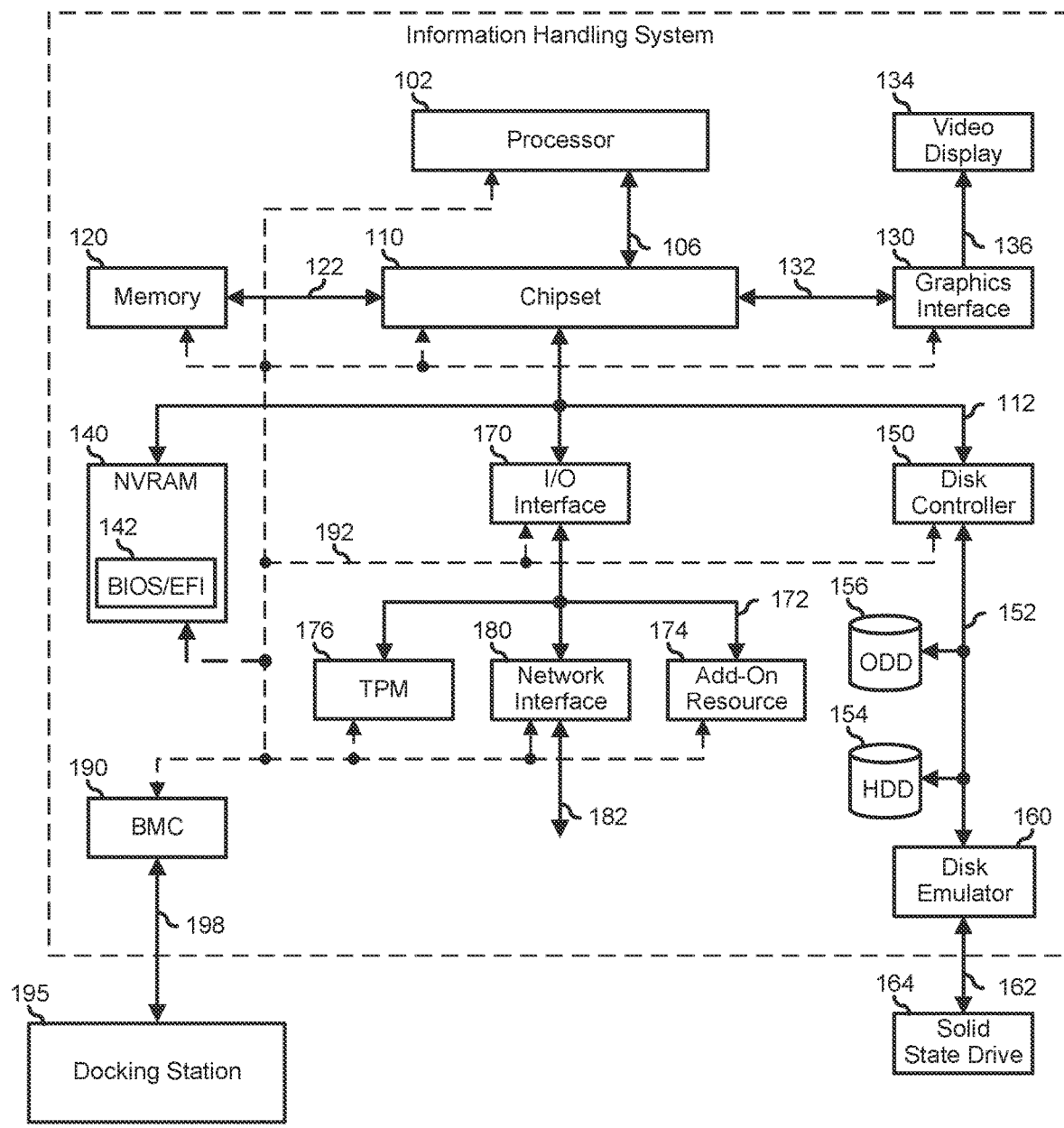
FIG. 1 is a block diagram illustrating an information handling system according to an embodiment of the present disclosure.

FIG. 1 illustrates an embodiment of an information handling system 100 including a processor 102, processor interface 106, chipset 110, memory 120, graphics adapter 130 connected to video display 134, non-volatile RAM (NV-RAM) 140 that includes a basic input and output system/extensible firmware interface (BIOS/EFI) module 142, disk controller 150, hard disk drive (HDD) 154, optical disk drive (ODD) 156, disk emulator 160 connected to solid state drive (SSD) 164, an input/output (I/O) interface 170 connected to an add-on resource 174, a trusted platform module (TPM) 176, a network interface 180, a baseboard management controller (BMC) 190, and a docking station 195 that is connected to the BMC 190 through a network interface 198. The information handling system 100 can be a personal computer, a laptop computer, a smart phone, a tablet device or other consumer electronic device, a network server, a network storage device, a switch router or other network communication device, or any other suitable device and may vary in size, shape, performance, functionality, and price. The elements depicted in information handling system 100 may not be representative of all elements of information handling systems in general. Moreover some elements as depicted in information handling system 100 may not be applicable to all information handling systems as described in the present embodiments.

Chipset 110 represents an integrated circuit or group of integrated circuits that manages data flow between the processor 102 and the other elements of information handling system 100. In a particular embodiment, chipset 110 represents a pair of integrated circuits, such as a north bridge component and a south bridge component. In another embodiment, some or all of the functions and features of chipset 110 are integrated with one or more of processors 102. Memory 120 is connected to chipset 110 via a memory interface 122. An example of memory interface 122 includes a Double Data Rate (DDR) memory channel, and memory 120 represents one or more DDR Dual In-Line Memory Modules (DIMMs). In a particular embodiment, memory interface 122 represents two or more DDR channels. In another embodiment, one or more of processors 102 include memory interface 122 that provides a dedicated memory for the processors. A DDR channel and the connected DDR DIMMs can be in accordance with a particular DDR standard, such as a DDR3 standard, a DDR4 standard, a DDR5 standard, or the like. Memory 120 may further represent various combinations of memory types, such as Dynamic Random Access Memory (DRAM) DIMMs, Static Random Access Memory (SRAM) DIMMs, non-volatile DIMMs (NV-DIMMs), storage class memory devices, Read-Only Memory (ROM) devices, or the like.

Graphics adapter 130 is connected to chipset 110 via a graphics interface 132, and provides a video display output 136 to a video display 134. An example of a graphics interface 132 includes a peripheral component interconnect-express interface (PCIe) and graphics adapter 130 can include a four lane (×4) PCIe adapter, an eight lane (×8) PCIe adapter, a 16-lane (×16) PCIe adapter, or another configuration, as needed or desired. In a particular embodiment, graphics adapter 130 is provided on a system printed circuit board (PCB). Video display output 136 can include a digital video interface (DVI), a high definition multimedia interface (HDMI), DisplayPort interface, or the like. Video display 134 can include a monitor, a smart television, an embedded display such as a laptop computer display, or the like.

NV-RAM 140, disk controller 150, and I/O interface 170 are connected to chipset 110 via I/O channel 112. An example of I/O channel 112 includes one or more point-to-point PCIe links between chipset 110 and each of NV-RAM 140, disk controller 150, and I/O interface 170. Chipset 110 can also include one or more other I/O interfaces, including an Industry Standard Architecture (ISA) interface, a Small Computer Serial Interface (SCSI) interface, an Inter-Integrated Circuit ($I^2C$) interface, a System Packet Interface (SPI), a Universal Serial Bus (USB), another interface, or a combination thereof. NV-RAM 140 includes BIOS/EFI module 142 that stores machine-executable code (BIOS/EFI code) that operates to detect the resources of information handling system 100, to provide drivers for the resources, to initialize the resources, and to provide common access mechanisms for the resources. The functions and features of BIOS/EFI module 142 will be further described below.

Disk controller 150 includes a disk interface 152 that connects the disk controller to HDD 154, to ODD 156, and to disk emulator 160. Disk interface 152 may include an integrated drive electronics (IDE) interface, an advanced technology attachment (ATA) such as a parallel ATA (PATA) interface or a serial ATA (SATA) interface, a SCSI interface, a USB interface, a proprietary interface, or a combination thereof. Disk emulator 160 permits a solid-state drive (SSD) 164 to be connected to information handling system 100 via an external interface 162. An example of external interface 162 includes a USB interface, an IEEE 1394 (Firewire) interface, a proprietary interface, or a combination thereof. Alternatively, SSD 164 can be disposed within information handling system 100.

I/O interface 170 includes a peripheral interface 172 that connects I/O interface 170 to add-on resource 174, to TPM 176, and to network interface 180. Peripheral interface 172 can be the same type of interface as I/O channel 112, or can be a different type of interface. As such, I/O interface 170 extends the capacity of I/O channel 112 when peripheral interface 172 and the I/O channel are of the same type, and the I/O interface translates information from a format suitable to the I/O channel to a format suitable to the peripheral channel 172 when they are of a different type. Add-on resource 174 can include a data storage system, an additional graphics interface, a NIC, a sound/video processing card, another add-on resource, or a combination thereof. Add-on resource 174 can be on a main circuit board, a separate circuit board or an add-in card disposed within information handling system 100, a device that is external to the information handling system, or a combination thereof.

Network interface device 180 represents a network communication device disposed within information handling system 100, on a main circuit board of the information handling system, integrated onto another element such as chipset 110, in another suitable location, or a combination thereof. Network interface device 180 includes a network channel 182 that provides an interface to devices that are external to information handling system 100. In a particular embodiment, network channel 182 is of a different type than peripheral channel 172 and network interface 180 translates information from a format suitable to the peripheral channel to a format suitable to external devices. In a particular embodiment, network interface device 180 includes a NIC or host bus adapter (HBA), and an example of network channel 182 includes an InfiniBand channel, a fiber channel, a gigabit Ethernet channel, a proprietary channel architecture, or a combination thereof. Network channel 182 can be connected to an external network resource (not illustrated). The network resource can include another information handling system, a data storage system, another network, a grid management system, another suitable resource, or a combination thereof.

BMC 190 is connected to multiple elements of information handling system 100 via one or more management interface 192 to provide out of band monitoring, maintenance, and control of the elements of the information handling system. As such, BMC 190 represents a processing device different from the processor 102, which provides various management functions for information handling system 100. In an embodiment, BMC 190 grants access to an external device. The BMC 190 may communicate with the external device using the network interface 198.

In an embodiment, the BMC 190 implements an integrated remote access controller (iDRAC) that operates to monitor and maintain system firmware, such as code stored in BIOS/EFI module 142, option ROMs for graphics interface 130, disk controller 150, add-on resource 174, network interface 180, or other elements of information handling system 100, as needed or desired. In particular, BMC 190 includes the network interface 198 that can be connected to a remote management system to receive firmware updates, as needed or desired. Here, BMC 190 receives the firmware updates, stores the updates to a data storage device associated with the BMC, transfers the firmware updates to NV-RAM of the device or system that is the subject of the firmware update, thereby replacing the currently operating firmware associated with the device or system, and reboots information handling system, whereupon the device or system utilizes the updated firmware image.

Docking station 195 includes hardware circuitry that integrates a portable information handling system quickly and easily into a desktop environment. The docking station 195 may allow the portable information handling system to connect with other devices or peripherals. The docking station 195 includes expansion features such as standard input/output (I/O) connectors to attach external monitors or video devices, universal serial bus (USB) connectors, power supply, and the like. In various embodiments, the processor 102 dynamically adjusts configurations of the docking station 195 to improve thermal capability and without acoustic impact in the desktop environment.

Figure 2:
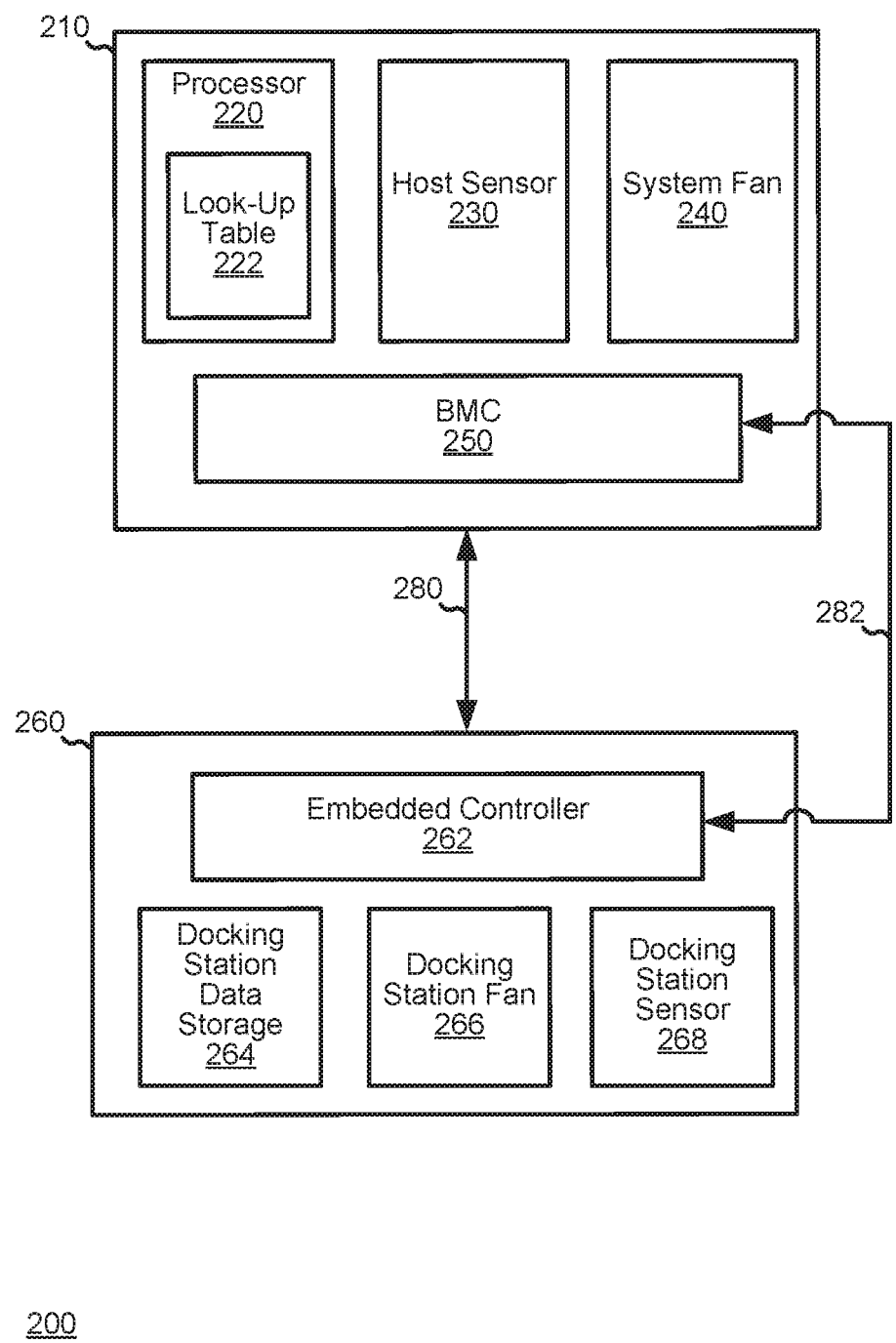
FIG. 2 is a block diagram illustrating a portion of the information handling system according to an embodiment of the present disclosure.

FIG. 2 shows a block diagram of an information handling system 200. Information handling system 200 includes a host 210 and a docking station 260. The host 210 may dynamically control operations of the docking station 260. The host 210 includes a processor 220 with a look-up table (LUT) 222, a host sensor 230, a system fan 240, and a BMC 250. The docking station 260 may provide a communication interface between the host 210 and other peripherals. The docking station 260 includes an embedded controller (EC) 262, docking station data storage 264, a docking station fan 266, and a docking station sensor 268. The host 210 may communicate to the docking station 260 through an interface 280 that includes an out-of-band interface 282 to connect the BMC 250 to the EC 262. The elements and components of the information handling system 200 are similar to the elements and components of the information handling system 100.

The host 210 may be configured to control the operations of the docking station 260 based upon a determined physical location of the docking station, and based upon an acoustic sound measurement of the system fan 240. The processor 220 may include hardware circuitry that is configured to control operations of the host 210, and to dynamically adjust operations of the docking station 260. In various embodiments, the processor 220 utilizes the host sensor 230 to determine proximity location of the docking station 260, and to measure the acoustic sound level of the system fan 240. With the determined physical location and acoustic sound measurements in sone (S), the processor 220 utilizes the LUT 222 in configuring the docking station fan 266 to improve thermal capability and to optimize acoustic performance. In other embodiments, the processor 220 performs the determination of the physical location and measurements of the acoustic sound level by sending instructions to the docking station 260. For example and in response to receiving instructions from the processor 220, the docking station 260 may utilize its own docking station sensor 268 to determine the physical location relative to position of the host 210 and to measure the acoustic sound level in the system fan 240. In this example, the docking station 260 may send the determined physical location and measured acoustic sounds to the processor 220. The docking station 260 may also send configurations of the docking station fan 266 to the processor 220. The configurations of the docking station fan 266 include fan speed in rounds per minute, docking station fan hysteresis, docking station fan controller trip sets, and the like.

The host sensor 230 may include hardware circuitry configured to send or receive signals that can be used to determine distances or to measure acoustic sound levels. To determine a particular position of the docking station 260 relative to present location of the host 210, the host sensor 230 may use a global positioning system (GPS) signal, a received signal strength indicator (RSSI) level, or a combination thereof. For example, the host sensor 230 may include a GPS receiver and an access to the GPS receiver of the docking station 260. In this example, the host sensor 230 may receive a GPS location of the host 210, and the GPS location of the docking station 260. In an embodiment, the processor 220 derives the proximity location of the docking station 260 based upon the received GPS locations. In another example, the host sensor 230 measures the RSSI level such as field strength of a near field communication (NFC) signal from the docking station 260. In this other example, the processor 220 can derive the physical location of the docking station 260 based upon field signal measured by the host sensor 230. In various embodiments, the host sensor 230 combines the use of the received GPS locations and the detected RSSI levels to increase accuracy in determining the proximity location of the docking station 260.

To measure acoustic sound in the information handling system 200, the host sensor 230 may use one or more microphones in the host 210. For example, a set of microphones are disposed in different areas of the host 210 for purposes of measuring the acoustic sound level. In this example, the set of microphones can measure the acoustic sound level of the system fan 240, the docking station fan 266, or a combination thereof. In various embodiments, the host sensor 230 measures the acoustic sound level of the system fan 240 after the determination of the physical location of the docking station 260. With the determined physical location and the measured acoustic sound level, the processor 220 can dynamically adjusts configurations of the docking station fan 266. For example and during a docking station calibration period, the host sensor 230 measures the acoustic sound from the system fan only. In this example, the processor 220 may dynamically adjust the configurations of the docking station fan 266 without having acoustic impact on the measured acoustic sound of the system fan. The docking station calibration period includes the period when the docking station fan operation is adjusted to minimize docking station housing temperature and to optimize generated acoustic sound level. In various other embodiments, the host sensor 230 may also use the one or more microphones to detect the physical location of the docking station 260. For example, a ping sound may be transmitted by the docking stations 260 towards the host 210. In this example, the host 210 receives the ping sound and the host calculates the physical location of sound source based upon characteristics of the received ping sound.

LUT 222 includes hardware circuitry configured to store data that can be used by the processor 220 to dynamically adjust configurations of the docking station fan 266. In an embodiment, the data includes predefined positions of the docking station 260 relative to the host 210, system fan acoustic sound levels, preconfigured docking station fan configurations to minimize acoustic impact, and the like. At a regular interval or upon a request from an end-user, the LUT 222 may receive updates from the processor 220. The updates may include adjustments in positions of the docking station 260, corresponding docking station fan configurations, and the like.

The BMC 250 is similar to the BMC 195. The BMC 250 may communicate with the EC 262 using the out-of-band interface 282 of the network interface 280. In various embodiments, the network interface 280 is a standard compliant USB cable with a cable length of about 3-5 feet. For example, a 3 feet USB cable connects the host 210 to the docking station 260. In this example, the docking station 260 may be positioned at different positions around the host 210.

The docking station 260 includes hardware circuitry that connects the host 210 to multiple peripherals. The EC 262 includes hardware circuitry that controls the operations of the docking station. The operations include configuring or reconfiguring the docking station fan 266, utilizing the docking station sensor 268, and/or storing the docking station fan configurations and other information to the data storage 264. In an embodiment, the EC 262 receives instructions from the processor 220 through the BMC 250. In this embodiment, the EC 262 implements the instructions in the elements and components of the dockings station 250. For example, the instructions to the docking station 260 include speed adjustments of the docking station fan 266, monitoring by the docking station of its GPS location, sending by the docking station of the monitored GPS location, sending by the docking station of NFC signal for RSSI reading by the host sensor 230, and the like. In this example, the EC 262 may utilize the docking station sensor 268 and the docking station data storage 264 to implement the received instructions.

The docking station sensor 268 includes hardware circuitry configured to send or receive signals that can be used to determine distance or directions, and to measure acoustic sound level in the information handling system 200. For example, the docking station sensor 268 includes the GPS receiver to determine its physical location. In this example, the host 210 may access the docking station's GPS receiver to determine the physical location of the docking station 260 relative to the location of the host. In another example and during the docking station calibration period, the docking station sensor 268 may determine proximity location of the host 210 based upon the RSSI level of a signal that is detected by the docking station. The signal may include a test signal that is generated at the host side. In this other example, the docking station 260 may send the information to the host 210 and the host may utilize this information to increase accuracy of calculating the proximity location between the host and the docking station.

The docking station data storage 264 include hardware circuitry configured to store measurements from the docking station sensor 268, instructions received by the docking station from the host 210, and other information relative to configuration or reconfiguration of the docking station fan 266. In various embodiments, the docking station data storage 264 is similar to the LUT 222 and stores data that can be used to configure or reconfigure the docking station fan. In this case, the processor 220 may use the docking station data storage 264 to access the data that may be used for adjusting operations of the docking station 260.

In various embodiments, the host 210 selects a quiet mode of operation or a tango mode of operation for the docking station fan. The quiet mode of operation includes configuration of the information handling system 200 where the host 210 allows the docking station fan 266 to operate without any dynamic adjustments from the host. For example, the host 210 can configure the docking station fan 266 to run at a constant speed of 2200 rpm. The tango mode of operation includes configuration of the information handling system 200 where the host 210 dynamically adjusts the configuration of the docking station fan 266 based upon proximity location of the docking station 260 and the measured acoustic sound of the system fan 240. The tango mode of operation includes a first tango mode and a second tango mode to improve thermal capability of the docking station housing and without increasing acoustic impact in the desktop environment.

FIGS. 3-4 show data 300 that can be stored in the LUT 222. The data 300 can include preconfigured reference values that may be used by the processor 220 during the quiet mode or the tango mode of operation. The data 300 includes an original table 310, a first tango mode table 320, and a second tango mode table 330. Each one of the original table 310, first tango mode table 320 and the second tango mode table 330 includes a system fan sound level 312, a system fan speed 314, and a docking station fan EC 350 including a hysteresis value 352 and a trip value 354. The system fan sound level 312 includes the measured acoustic sound level of the system fan 240 at a particular system fan speed. The system fan speed 314 includes revolutions per minute rotation of the system fan during the quiet mode or tango mode of operation. The hysteresis value 352 includes a particular amount of temperature difference that can be used as a reference by the docking station fan EC 350 to turn ON or OFF the docking station fan 266. The trip value 354 may include a reference value used by the docking station fan EC 350 to change to a different system fan speed.

In an embodiment and when the quiet mode of operation is selected by the host 210, the host may use the original table 310 to set the docking station fan configurations. In this embodiment, the original table 310 is a default setting of the docking station fan 266. For example and based upon the accessed original table 310, the docking station fan EC 350 turns ON the docking station fan when the trip value 354 is about 44° C. In this example, the docking station fan EC 350 may utilize the next trip value 354 of about 55° C. when the measured system fan sound level increases to 0.4 S. In other embodiments where the original table 310 is used by the host 210 for the tango mode of operation, the host applies the original table 310 when the measured system fan sound level is below 0.7 S.

In an embodiment and when the first tango mode of operation is selected by the host 210, the host may use the first tango mode table 320 to set the docking station fan configurations. In this embodiment, the host 210 may dynamically adjust configurations of the docking station fan 266 when the measured system fan sound level 312 is between 0.7 S to 2 S. For example and based upon the accessed first tango mode table 320, the docking station fan EC 350 uses the trip value 354 of about 75° C. to change the system fan speed. In this example, the host uses the first tango mode table 320 when the measured system fan sound level 312 is between 0.7 S to 2 S. In this example still, the adjustment in the configuration of the docking station fan 266 may not have acoustic impact on the system fan sound level 312. In other words, the information handling system 200 will have the same system fan sound level 312 even though power is increased at the side of docking station fan 266.

In an embodiment and when the second tango mode of operation is selected by the host 210, the host may use the second tango mode table 330 to set the docking station fan configurations. In this embodiment, the host 210 may dynamically adjust configurations of the docking station fan 266 when the measured system fan sound level 312 is greater than 2 S. For example and based upon the accessed second tango mode table 330, the docking station fan EC 350 uses the trip value 354 of about 74° C. to change the system fan speed. In this example, the host uses the second tango mode table 330 when the measured system fan sound level 312 is greater than 2 S. In this example still, the configuration adjustment of the docking station fan 266 may not generate acoustic impact on the system fan sound level 312. In other words, the information handling system 200 will have the same system fan sound level 312 even though power is increased at the side of docking station fan 266.

Figure 5:
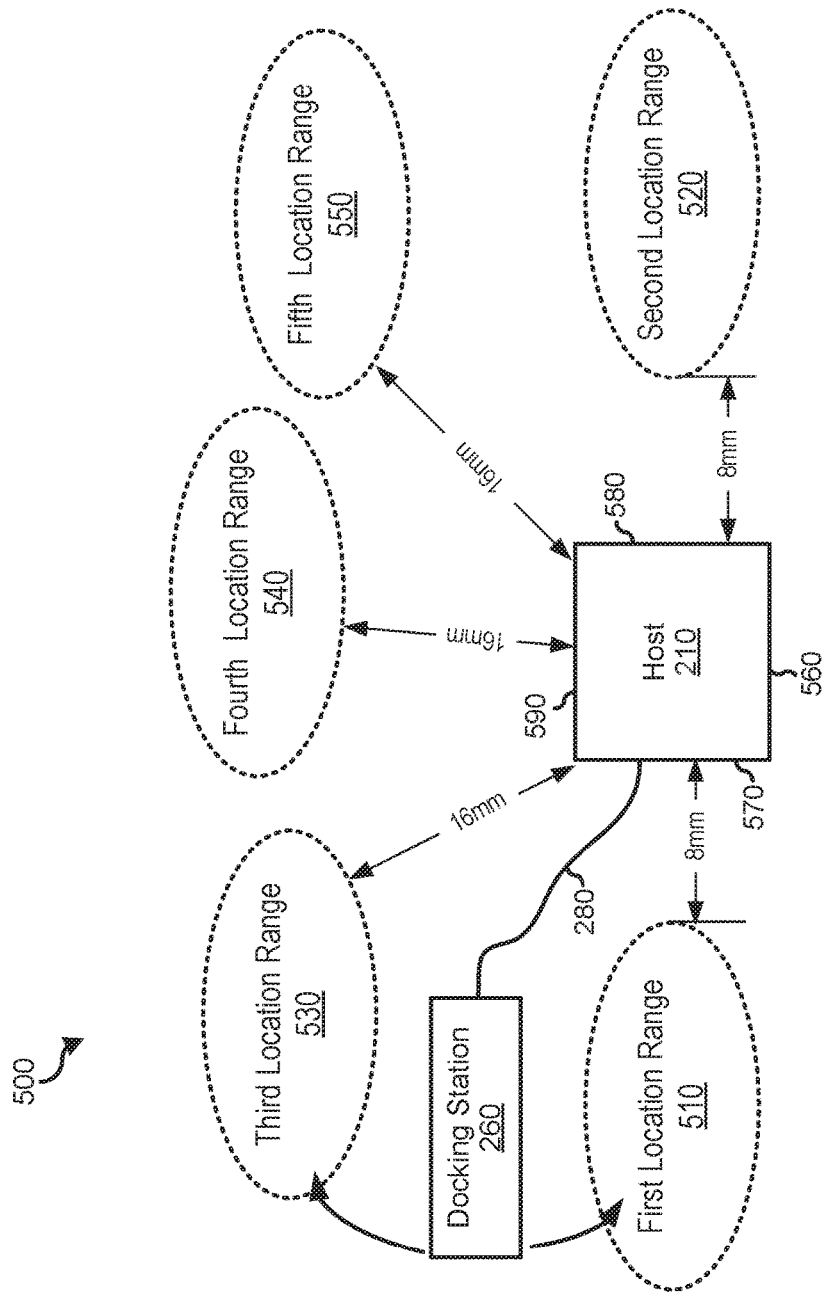
FIG. 5 is an arrangement showing the docking station that is positioned at different locations around a host according to an embodiment of the present disclosure.

FIG. 5 shows an arrangement 500 between the host 210 and the docking station 260. The arrangement 500 includes the host 210, the docking station 260, the network interface 280, a first location range 510, a second location range 520, a third location range 530, a fourth location range 540, and a fifth location range 550. The host 210 further includes a front side 560, a first short side 570, a second short side 580, and a rear side 590. The first location range 510 to fifth location range 550 may include predefined areas where the docking station 260 may be positioned in the desktop environment.

In an embodiment, the first location range 510 includes an area that is adjacent to the first short side 570 of the host 210. In this embodiment, the first location range 510 is about 8 mm distance from the first short side 570. In this regard, the first location range 510 may be treated as a non-rear side of the host 210. In various embodiments, the docking station 260 is located at the non-rear side of the host 210 when the proximity location of the docking station to the first short side 570 is 8 mm or less.

In an embodiment, the second location range 520 includes an area that is adjacent to the second short side 580 of the host 210. In this embodiment, the second location range 520 is about 8 mm distance from the second short side 580. In this regard, the second location range 520 may be treated as located at the non-rear side of the host 210. In various embodiments, the docking station 260 is located at the non-rear side of the host 210 when the proximity location of the docking station to the second short side 580 is 8 mm or less.

In an embodiment, the third location range 530, fourth location range 540, and the fifth location range 550 are disposed at a rear side of the host 210. In this embodiment, the third location range 530, fourth location range 540, or the fifth location range 550 is about 21 mm distance from the rear side 590. In this regard, these locations may be treated as located at the rear side of the host 210. In other embodiments, different other location areas may be defined and corresponding adjustments in the LUT data may be performed to improve thermal capability of the docking station 260.

Figure 6:
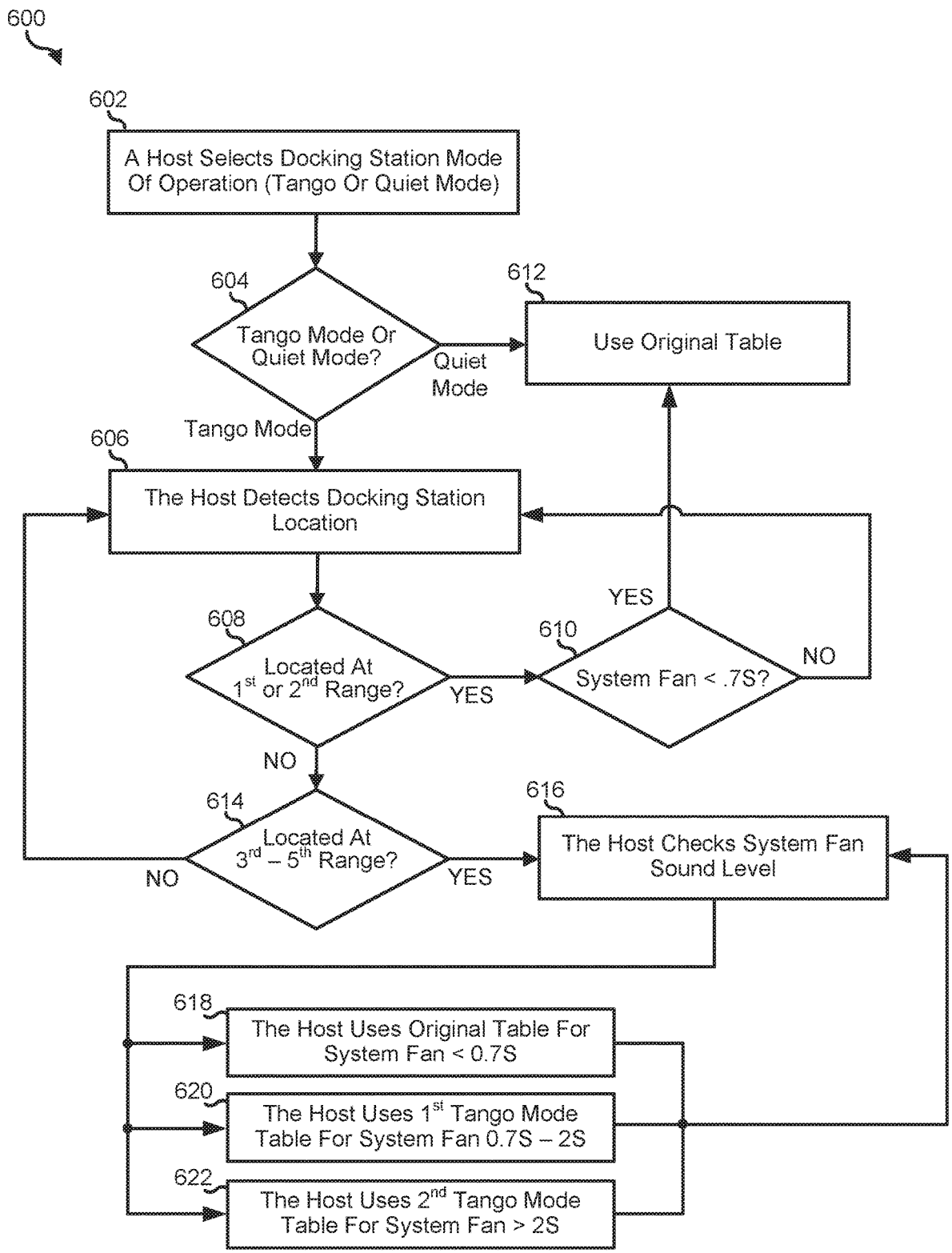
FIG. 6 is a flow chart for a method of managing operations of a docking station fan according to an embodiment of the present disclosure.

FIG. 6 shows a method 600 for managing docking station fan configurations. At block 602, the host selects docking station mode of operation. For example and during a system boot up, the host 210 can detect the docking station status. In this example, the host 210 may select the docking station mode for the detected docking station status. At block 604, the selection is determined whether it is a tango mode or a quiet mode of operation. For the tango mode of operation, and at block 606, the host detects a location range of the docking station 250. At block 608, the host determines whether the detected location range is in the first location range or second location range. For example, the host 210 determines whether the docking station 260 is positioned at the first location range 510 or the second location range 520.

In a case where the docking station 260 is positioned at either of the first location range 510 or the second location range 520, then at block 610, the host 210 checks system fan sound level and determines whether the system fan sound level is less than 0.7 S. In response to the determined system fan sound level that is less than 0.7 S, and at block 612, the host 210 utilizes the original table for the docking station fan configuration. For example, the host 210 may obtain the original table 310 from the LUT 222. In this example, the host 210 uses the obtained original table 310 to configure docking station fan configuration. In response to the determined system fan sound level that is not lesser than 0.7 S, the host 210 performs another detection of the docking location at block 606. Returning to block 604 and for the quiet mode of operation, the host 210 selects the original table 310 at block 612 and the host applies the original table for the docking station fan configuration.

Returning to block 608 and in response to the detected location range that is not in the first location range and second location range, the host 210 determines at block 614 whether the detected location range is in a third location range, fourth location range, or fifth location range. For example, the host 210 determines whether the docking station 260 is positioned at the third location range 530, fourth location range 540, or fifth location range 550. If so, then at block 616, the host 210 checks the system fan sound level. In response the determined system fan sound level that is lesser than 0.7 S, then at block 618, the host 210 selects the original table 310 to be applied to the docking station fan configuration. In response the determined system fan sound level that is between 0.7 S to 2 S, then at block 620, the host 210 selects the first tango mode table 320 to be applied for dynamic adjustment of the docking station fan configuration. In response the determined system fan sound level that is greater than 2 S, then at block 622, the host 210 selects the second tango mode table 330 to be applied for dynamic adjustment of the docking station fan configuration. In various embodiments, the host 210 detects the docking station location at block 606 and checks the system fan sound level at block 616 at different intervals. For example, the host 210 detects the docking station location at block 606 every two minutes while the checking of the system fan sound level is performed after every one minute.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

For purposes of this disclosure, the information handling system can include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, the information handling system can be a personal computer, a laptop computer, a smart phone, a tablet device or other consumer electronic device, a network server, a network storage device, a switch router or other network communication device, or any other suitable device and may vary in size, shape, performance, functionality, and price. Furthermore, the information handling system can include processing resources for executing machine-executable code, such as a central processing unit (CPU), a programmable logic array (PLA), an embedded device such as a System-on-a-Chip (SoC), or other control logic hardware. Information handling system can also include one or more computer-readable medium for storing machine-executable code, such as software or data. Additional components of information handling system can include one or more storage devices that can store machine-executable code, one or more communications ports for communicating with external devices, and various I/O devices, such as a keyboard, a mouse, and a video display. Information handling system can also include one or more buses operable to transmit information between the various hardware components.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. An information handling system, comprising:
a docking station including a docking station fan; and
a host coupled to the docking station, the host including:
 a system fan;
 a host sensor configured to detect a physical location of the docking station and to measure an acoustic sound level of the system fan; and
 a processor configured to control an operation of the docking station fan based upon the detected physical location and the measured acoustic sound level.

2. The information handling system of claim 1, wherein the processor controls the operation of the docking station fan using a first table when the docking station is positioned at a rear side of the host and the measured acoustic sound level is between 0.7 sone (S) to 2S.

3. The information handling system of claim 1, wherein the processor configures the docking station fan using a second table when the docking station is positioned at a rear side of the host and the measured acoustic sound level is greater than 2S.

4. The information handling system of claim 1, wherein the processor configures the docking station fan using an original table when the docking station is positioned at a first short side of the host and the measured acoustic sound level is less than 0.7S.

5. The information handling system of claim 4, wherein the original table includes a default setting of the docking station fan.

6. The information handling system of claim 1, wherein the processor configures the docking station fan using an original table when the processor selects a quiet mode of operation.

7. The information handling system of claim 6, wherein the quiet mode of operation includes a configuration where no dynamic adjustment is performed on the docking station fan.

8. The information handling system of claim 1, wherein the host further includes a look-up table that stores data used as a reference by the host to control the operation of the docking station fan.

9. The information handling system of claim 1, wherein the host sensor uses a combination of a global positioning system signal and received signal strength indicator level to determine the physical location of the docking station.

10. The information handling system of claim 1, wherein the host includes a set of microphones that are configured to measure the acoustic sound level of the docking station fan, the system fan, or a combination thereof.

11. An information handling system, comprising:
a docking station including a docking station fan; and
a host coupled to the docking station, the host including:
 a system fan;
 a host sensor configured to detect a physical location of the docking station and to measure an acoustic sound level of the system fan;
 a look-up table that stores data; and
 a processor configured to use the data to control an operation of the docking station fan based upon the detected physical location and the measured acoustic sound level.

12. The information handling system of claim 11, wherein the processor controls the operation of the docking station fan using a first table when the docking station is positioned at a rear side of the host and the measured acoustic sound level is between 0.7 sone (S) to 2S.

13. The information handling system of claim 11, wherein the processor configures the docking station fan using a second table when the docking station is positioned at a rear side of the host and the measured acoustic sound level is greater than 2S.

14. The information handling system of claim 11, wherein the processor configures the docking station fan using an original table when the docking station is positioned at a first short side of the host and the measured acoustic sound level is less than 0.7S.

15. The information handling system of claim 14, wherein the original table includes a default setting of the docking station fan.

16. The information handling system of claim 11, wherein the processor configures the docking station fan using an original table when the processor selects a quiet mode of operation.

17. The information handling system of claim 16, wherein the quiet mode of operation includes a configuration where no dynamic adjustment is performed on the docking station fan.

18. A method, comprising:
determining, by a host, a physical location of a docking station;
selecting a mode of operation for the docking station, the mode of operation including a quiet mode or a tango mode;
measuring an acoustic sound level of a system fan; and
controlling an operation of the docking station based upon the selected mode of operation, the determined physical location, and the measured acoustic sound level of the system fan.

19. The method of claim 18, wherein the determining of the physical location utilizes a combination of a global positioning system signal and received signal strength indicator level.

20. The method of claim 18, wherein the controlling of the operation of the docking station includes use of a first table when the docking station is positioned at a rear side of the host and the measured acoustic sound level is between 0.7 sone (S) to 2S.

* * * * *